United States Patent
Hasegawa et al.

(10) Patent No.: US 7,058,183 B2
(45) Date of Patent: Jun. 6, 2006

(54) SOUND CORRECTION SYSTEM, RECORDING MEDIUM ON WHICH A SOUND CORRECTION PROGRAM IS RECORDED, SOUND CORRECTION METHOD AND SOUND CORRECTION APPARATUS

(75) Inventors: Shin Hasegawa, Kawagoe (JP); Akira Iwasaki, Kawagoe (JP); Kensaku Yoshida, Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 0 days.

(21) Appl. No.: 10/760,364

(22) Filed: Jan. 21, 2004

(65) Prior Publication Data

US 2004/0151328 A1 Aug. 5, 2004

(30) Foreign Application Priority Data

Jan. 23, 2003 (JP) ............................. 2003-014455

(51) Int. Cl.
*H04B 1/00* (2006.01)

(52) U.S. Cl. ........................... 381/86; 381/57; 381/98; 381/103; 381/107

(58) Field of Classification Search ................. 381/86, 381/57, 104, 107, 108, 109; 455/238.1
See application file for complete search history.

(56) References Cited

U.S. PATENT DOCUMENTS

| 4,641,344 A | * | 2/1987 | Kasai et al. | 381/86 |
| 5,208,866 A | * | 5/1993 | Kato et al. | 381/107 |
| 5,872,852 A | * | 2/1999 | Dougherty | 381/86 |

FOREIGN PATENT DOCUMENTS

JP 7-94985 4/1995

* cited by examiner

*Primary Examiner*—Brian T. Pendleton
(74) *Attorney, Agent, or Firm*—Young & Thompson (57) ABSTRACT

The object of this invention is to obtain the optimum music level by separately and independently performing the sound correction for the high-frequency range and low-frequency range according to the noise level. The invention comprises: a memory unit in which high-frequency-correction-level information, corresponding to the vehicle speed and music level, and low-frequency-correction-level information, corresponding to the low-frequency noise/music level ratio, are stored; a high-frequency-correction-level-information-acquisition unit that obtains high-frequency-correction-level information based on the vehicle speed and music level; and a low-frequency-correction-level-information-acquisition unit that obtains low-frequency-correction-level information based on the low-frequency noise/music level ratio; and it corrects the sound by a sound-quality-adjustment unit based on the high-frequency-correction-level information and low-frequency-correction-level information.

9 Claims, 7 Drawing Sheets

SOUND CORRECTION SYSTEM, RECORDING MEDIUM ON WHICH A SOUND CORRECTION PROGRAM IS RECORDED, SOUND CORRECTION METHOD AND SOUND CORRECTION APPARATUS

BACKGROUND OF THE INVENTION

1. Field of the Invention

This invention relates to a sound-correction system, a recording medium on which a sound-correction program is recorded, a sound-correction method and a sound-correction apparatus.

2. Description of the Related Art

When listening to music or the like using the audio apparatus installed inside a vehicle, it sometimes becomes difficult to hear the sound from the car-audio system due to various noise from the outside surroundings when the vehicle is moving.

For example, when traveling over a bad road, the road noise that occurs between the tires and the road surface becomes large, and it may not be possible to hear very much music from the car audio at all.

Particularly, in the case where the vehicle is an automobile with a roof, when the roof is open, the noise sensed inside the vehicle from the outside surroundings becomes even larger.

Conventionally, as measures taken against this kind of noise, the audio apparatus installed in the automobile performed control that automatically changed the volume of the audio apparatus when the power windows of the vehicle were opened or closed for example, refer to Japanese Laid-Open patent application no. H7-94985.

One kind of noise that occurs when moving is road noise that occurs between the tires and the road surface. This road noise is mainly low-frequency noise such as occurs when traveling at slow speed over a bad road, however, when traveling on a freeway, middle- to high-frequency noise occurs due to the sound of the wind.

With the conventional technology described above, the sound is changed simply when the power windows are opened or closed, so correction is not performed when low-frequency noise occurs due to road noise, or when high-frequency noise occurs due to the sound of the wind when traveling on a freeway, so there was a problem in that the sound becomes difficult to hear.

SUMMARY OF THE INVENTION

The object of this invention is to provide optimum sound by adjusting the sound volume according to the noise level for each frequency range according to various parameters (conditions), and by correcting the sound of the music levels corresponding to the various noises.

(1) The above object of the present invention is a sound-correction system in the audio apparatus installed in a vehicle and comprises: a music-adjustment device such as a sound-quality-adjustment unit or a full-range-sound-volume-correction unit which corrects the sound; and a noise-information-detection device such as a correction unit which detects noise information; and where the music-adjustment device corrects the sound according to the noise level detected by the noise-information-detection device.

According to the present invention, sound correction is performed based on the detected noise level, so it is possible to obtain optimum sound even when the noise is large.

(2) In one aspect of the present invention, the noise-information-detection device comprises an extraction device which extracts low-frequency-noise level that occurs from the vehicle; and the music-adjustment device corrects the sound based on the detected low-frequency-noise level.

According to present invention it is possible to obtain optimum sound even when the noise that occurs due to low-frequency sound, such as occurs when traveling on a bad road, becomes large.

(3) In another aspect of the present invention, the noise-information-detection device comprises a first detection device which detects the vehicle speed; and the music-adjustment device corrects the sound based on the detected vehicle speed.

According to the present invention, sound correction is performed based on the vehicle speed, so it is possible to obtain optimum sound even when the noise that occurs due to the sound of the wind, such as occurs when traveling at high speed, becomes large.

(4) In a further aspect of the present invention, the noise-information detection device comprises a second detection device which detects opened/closed information of an opening/closing mechanism of the vehicle; and the music-adjustment device corrects the sound based on the detected opened/closed information.

According to the preset invention, by making the correction level when the roof is opened be larger than the correction level when the roof is closed, it is possible to obtain more optimum sound.

(5) In a further aspect of the present invention, the noise-information-detection device comprises a third-detection device which detects the music level; and the music-adjustment device corrects the sound based on the detected music level.

According to the present invention, the amount of correction increases as the music level becomes low, so it is possible to obtain more optimum sound regardless of the size of the music level.

(6) In a further aspect of the present invention, the music-adjustment device comprises: a low-frequency-correction device which corrects low-frequency sound, a high-frequency-correction device which corrects high-frequency sound, and a full-range-correction device which corrects full-range sound.

According to the present invention, high-frequency correction and low-frequency correction are performed separately and independently, so it is possible to obtain optimum sound.

(7) In a further aspect of the invention, the low-frequency-correction device corrects the sound based on the low-frequency noise detected by the extraction device.

According to the present invention, when traveling at low speed on a bad road, only low-frequency sound is corrected according to the low-frequency noise, so it is possible to obtain optimum sound.

(8) In a further aspect of the invention, the high-frequency-correction device corrects the sound based on the vehicle speed detected by the first detection device, and the opened/closed information detected by the second detection device.

According to the present invention, high-frequency correction is performed based on the vehicle speed and the opened/closed information, so it is possible to obtain optimum sound even when high-frequency noise due to the sound of the wind, such as occurs when traveling at high speed or when the opening/closing mechanism is opened, becomes large.

(9) In a further aspect of the present invention, the full-range correction device corrects the sound based on the vehicle speed detected by the first detection device, and the opened/closed information detected by the second detection device.

According to the present invention, high-frequency correction is performed based on the vehicle speed and the opened/closed information, so it is possible to obtain optimum sound even when high-frequency noise due to the sound of the wind, such as occurs when traveling at high speed or when the opening/closing mechanism is opened, becomes large.

(10) The above object of the present invention is a recording medium which is readable by a computer included in the sound-correction system of an audio apparatus installed in a vehicle, and on which a sound-correction program is recorded, where in the program causes the computer to function as a music-adjustment device such as a sound-quality-adjustment unit or a full-range-sound-volume-correction unit for adjusting the music level; and as a noise-information-detection device such as a correction unit which detects noise information; and where the music-adjustment device adjusts the sound according to the noise level detected by the noise-information-detection device.

According to the present invention, by reading and executing the sound-correction program by the computer, sound correction is performed based on the detected noise level, so it is possible to obtain optimum sound even when the noise is large.

(11) The above object of the present invention is a sound-correction method in the audio apparatus installed in a vehicle and comprises: a music-adjustment process such as a sound-quality-adjustment unit or a full-range-sound-volume-correction unit for adjusting the music level; and a noise-information-detection process such as a correction unit of detecting noise information; and where the music-adjustment process adjusts the sound according to the noise level detected by the noise-information-detection process.

According to the present invention, sound correction is performed based on the detected noise level, so it is possible to obtain optimum sound even when the noise is large.

(12) The above object of the present invention is a sound-correction apparatus in the audio apparatus installed in a vehicle and comprises: an adjustment device such as a full-range-sound-volume-correction unit for adjusting the sound-volume in the full frequency range of the reproduced signal; a low-frequency-correction device such as a low-frequency-sound-quality-adjustment unit which corrects the sound in the low-frequency range; a high-frequency-correction device such as a high-frequency-sound-quality-adjustment unit which corrects sound in the high-frequency range; an extraction device such as a low-frequency-noise-detection unit that extracts the low-frequency component below the audible frequency; a first detection device such as a vehicle-speed-detection unit that detects the vehicle speed; a second detection device such as a roof-opened/closed-detection unit that detects the opened/closed status of the opening/closing function in the vehicle; a third detection device such as a music-detection unit which detects the amount of adjustment of the adjustment device; a first calculation device such as a low-frequency-correction-level-information-acquisition unit that calculates the amount of low-frequency correction such as the low-frequency-correction-level information that is corrected by the low-frequency-correction device according to the ratio of the low-frequency component extracted by the extraction device, and the adjustment amount detected by the third detection device; and a second calculation device such as a sound-volume/high-frequency-correction-level-information-acquisition unit that calculates the amount of high-frequency correction such as the high-frequency-correction-level information corrected by the high-frequency-correction device according to the detected vehicle speed, the detected opened/closed status and the detected adjustment amount.

According to the present invention, sound-volume/high-frequency correction is performed based on the vehicle speed, so when high-frequency noise that occurs due to the sound of the wind when traveling at high speed is large, full-range-sound-volume adjustment and only high-frequency-sound-quality adjustment are performed; however, when traveling at low speed over a bad road, only low-frequency correction is performed according to the ratio of the low-frequency noise and the music level. Therefore, it is possible to obtain optimum sound for all conditions. Also, since the width of sound-volume/high-frequency-correction level changes according to the music level, it is possible to obtain even more optimum sound regardless of the size of the sound level.

(13) In one aspect of the present invention, the sound-correction apparatus comprises a memory device that stores the amount of low-frequency correction in correspondence to the ratio of the low-frequency component detected by the extraction device, and the amount of adjustment detected by the third detection device, and stores the amount of high-frequency correction in correspondence to the detected adjustment amount, vehicle speed and opened/closed status; and the low-frequency-correction device performs correction based on the amount of low-frequency correction stored in the memory device, and the high-frequency-correction device performs correction based on the amount of high-frequency correction stored in the memory device.

According to the present invention, correction can be performed based on correction amounts that are stored beforehand in the memory device.

(14) In another aspect of the present invention, the sound-correction apparatus increases the amount of low-frequency correction with respect to the adjustment amount detected by the third detection device as the level of the low-frequency component extracted by the extraction device increases.

According to the present invention, it is possible to obtain more optimum sound regardless of the size of the music level.

(15) In a further aspect of the present invention, the amount of low-frequency correction is the amount that sound of frequencies below a specified frequency is corrected, and it increases the lower the frequency is.

According to the present invention, the optimum low-frequency range is corrected with respect to low-frequency noise such as road noise, and it is possible to obtain more optimum sound.

(16) In a further aspect of the present invention, the amount of high-frequency correction is the amount that the sound in the full range of the signal being reproduced is corrected, and it increases the higher the frequency is.

According to the present invention, the optimum high-frequency range is corrected with respect to high-frequency noise that occurs due to the sound of the wind, and it is possible to obtain more optimum sound.

(17) In a further aspect of the present invention, the amount of high-frequency correction increases as the vehicle speed increases.

According to the present invention, the optimum high-frequency range is corrected with respect to high-frequency noise that occurs due to the sound of the wind, and it is possible to obtain more optimum sound.

(18) In a further aspect of the present invention, the amount of high-frequency correction when the opening/closing mechanism is opened increases with respect to the amount of high-frequency correction when the opening/closing mechanism is closed.

According to the present invention, correction is performed such that the sound becomes large when the roof is opened, so it is possible to obtain more optimum sound regardless of whether the roof is opened or closed.

(19) In a further aspect of the present invention, the amount of high-frequency correction decreases as the adjustment amount detected by the third detection device increases.

According to the present invention, the optimum high-frequency range is corrected so it is possible to obtain more optimum sound regardless of the size of the music level.

(20) The above object of the present invention is a sound-correction method for the audio apparatus installed in a vehicle having an adjustment process such as a full-range-sound-volume-correction unit for adjusting the sound volume of the full frequency range of the signal being reproduced, and comprises: an extraction process such as a low-frequency-noise-detection unit for extracting the low-frequency component such as low-frequency noise below the audible frequency; a first detection process such as a vehicle-speed-detection unit that detects the vehicle speed; a second detection process such as a roof-opened/closed-detection unit for detecting the opened/closed status of an opening/closing mechanism in the vehicle such as the roof; a third detection process such as a music-detection unit for detecting the adjustment amount by the adjustment device; an acquisition process such as a comparison unit for acquiring the ratio of the low-frequency component extracted by the extraction device and the adjustment amount detected by the third detection device; a first calculation process such as a low-frequency-correction-level-information-acquisition unit for calculating the low-frequency-correction characteristics such as the low-frequency-correction-level information according to the ratio calculated by the acquisition process; a second calculation process such as a sound-volume/high-frequency-correction-level-information-acquisition unit for calculating the high-frequency-correction characteristics such as the high-frequency-correction-level information according to the adjustment amount, vehicle speed and opened/closed status; a low-frequency-correction process such as a low-frequency-sound-quality-adjustment unit for correcting the sound in the low-frequency range based on the low-frequency-correction characteristics calculated by the first calculation process; and a high-frequency-correction process such as a high-frequency-sound-quality-adjustment unit for adjusting the sound in the high-frequency range based on the high-frequency-correction characteristics calculated by the second calculation process.

According to the present invention, sound-volume/high-frequency correction is performed based on the vehicle speed so full-range-sound-volume adjustment and only high-frequency-sound-quality adjustment are performed when the high-frequency noise that occurs due to the sound of the wind when traveling at high speed becomes large; however, when traveling at low speed over a bad road, only low-frequency noise is corrected according to the ratio of the low-frequency noise and music level. Therefore it is possible to obtain optimum sound in all conditions.

Also, since the width of the sound-volume/high-frequency-correction level changes according to the music level, it is possible to obtain more optimum sound regardless of the size of the music level.

DESCRIPTION OF THE PREFERRED EMBODIMENTS

The preferred embodiments of the invention will be explained with reference to the drawings.

Embodiment 1

Figure 1:
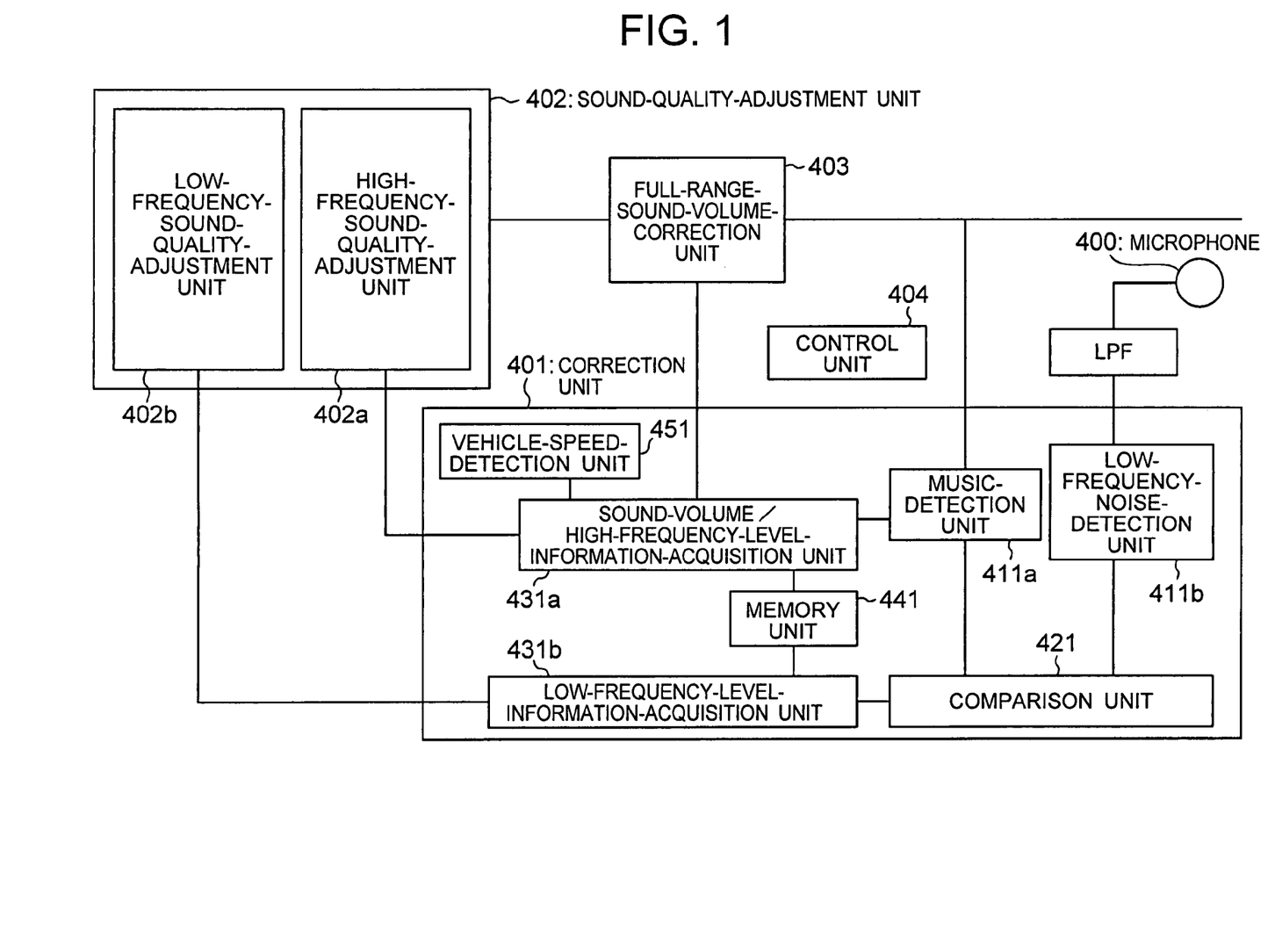
FIG. 1 is an overall schematic drawing of the sound-correction system of a car-audio system of a first embodiment of the invention.

FIG. 1 is an overall schematic drawing of the sound-correction system for a car-audio system.

The sound-correction system comprises: a microphone 400, a correction unit 401 as a noise-information-detection device, a sound-quality-adjustment unit 402 as a music-adjustment device, a full-range-sound-volume-correction unit 403 as a full-range-correction device, and a control unit 404.

The microphone 400 is located on the vehicle, and it picks up low-frequency noise, for example noise below 10 Hz, such as the sound of the engine that occurs when the vehicle is moving, or so-called road noise that occurs due to friction between the tires the surface of the road.

The correction unit 401 comprises: a music-detection unit 411a as a third detection device, a low-frequency-noise-detection unit 411b as an extraction device, a comparison unit 421, a sound-volume/high-frequency-correction-level-information-acquisition unit 431a as a second calculation unit, a low-frequency-correction-level-information-acquisition unit 431b as a first calculation unit, a memory unit 441 as a memory device, and a vehicle-speed-detection unit 451 as a first detection device.

The music-detection unit 411a is for detecting the music-signal level from the car-audio system. This music-signal level is the music-signal level after passing through the sound-quality-adjustment unit 402 and full-range-sound-volume-correction unit 403 and at the stage before the power amplifier. However, this music-signal level can also be the value of the current sound volume that is adjusted by a sound-volume-control unit or the like.

The low-frequency-noise-detection unit 411b is for detecting the noise that is picked up by the microphone 400.

The signal from the microphone 400 passes through a low-pass filter, and low-frequency noise that is below a suitable frequency (for example 10 Hz), such as the low-frequency component that is below the audible frequency, is extracted, and this low-frequency noise is input to the comparison unit 421. It is preferred that the cutoff frequency of the low-pass filter be a frequency for which a frequency range contained in the music can be actually removed.

The low-frequency noise that is detected by the low-frequency-noise-detection unit 411b is used as a parameter for determining levels, such as road noise that is below the audible frequency, and is not the road noise itself. The cutoff frequency of the low-pass filter can also be set to a frequency that cuts off the high-frequency component contained in the actual road noise. By setting the cutoff frequency to be low, it is possible to prevent the low-frequency component of the music reproduced by the car-audio system from being detected mistakenly as low-frequency noise. The comparison unit 421 is for obtaining the ratio between the music level from the car-audio system that is detected by the music-detection unit 411a, and the low-frequency-noise level that is detected by the low-frequency-noise-detection unit 411b. The sound-volume/high-frequency-correction-level-information-acquisition unit 431a is for obtaining the sound-volume/high-frequency-correction-level information Aahn based on the sound-volume level that is detected by the music-detection unit 411a and the vehicle speed that is detected by the vehicle-speed-detection unit 451.

The low-frequency-correction-level-information-acquisition unit 431b is for obtaining the low-frequency-correction-level information Aln based on the results of comparing the sound-volume level and the low-frequency-noise level by the comparison unit 421.

The memory unit 441 stores the sound-volume/high-frequency-correction-step value Sahn that corresponds to the vehicle speed Vn, the sound-volume/high-frequency-correction-level information Aahn that corresponds to the sound-volume/high-frequency-correction-step value Sahn, the low-frequency-correction-step value Sln that corresponds to the low-frequency noise/music level ratio, and the low-frequency-correction-level information Aln that corresponds to the low-frequency-correction-step value Sln.

Next, a summary of the sound correction performed in this embodiment will be explained.

In this embodiment, the high-frequency-correction level is increased as the speed of the vehicle Vn increases. As will be described later, as the high-frequency-correction level is increased, the high-frequency range is increased more than any other frequency band, and in this embodiment, the reproduction level is increased for the full-frequency range. Furthermore, in this embodiment, when selecting the high-frequency-correction level, fine adjustment is executed that reflects the music level that is being reproduced at that time on the high-frequency-correction level.

In other words, taking into consideration the fact that the music becomes more difficult to hear when the music level is low due to noise such as the sound of the wind that occurs as the speed of vehicle increases, the correction level is increased and fine adjustment is executed such that the music is easier to hear. Also, taking into consideration that the degree that the music becomes difficult to hear due to noise when the music level of the music being reproduced is high, the correction level is reduced.

Also, in this embodiment, in addition to the correction of the high-frequency level described above, low-frequency correction is executed according to the ratio of the low-frequency-noise level and the music level. The low-frequency-correction level is increased according to the increase in low-frequency noise that is detected by way of the microphone 400. Low-frequency correction is performed according to the ratio of the low-frequency noise and music level, so, similar to high-frequency correction, correction is executed according to the music level.

Next, the sound-correction process will be explained in detail.

Figure 2A:
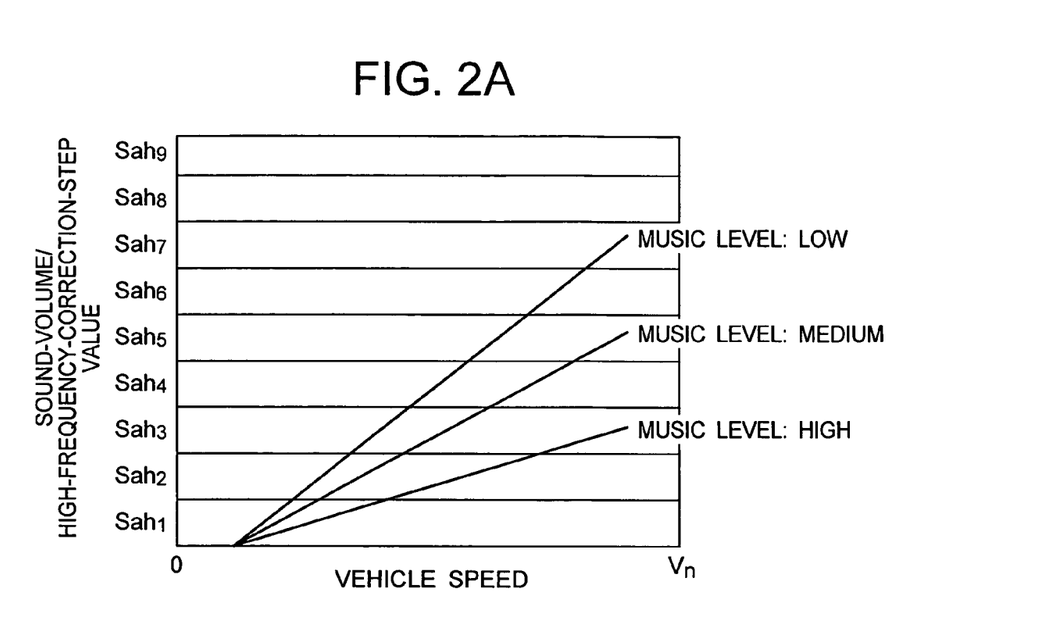
FIGS. 2A and 2B are graphs showing the sound volume/high-frequency-correction level information corresponding to the speed of the vehicle and the music level.
Figure 2B:
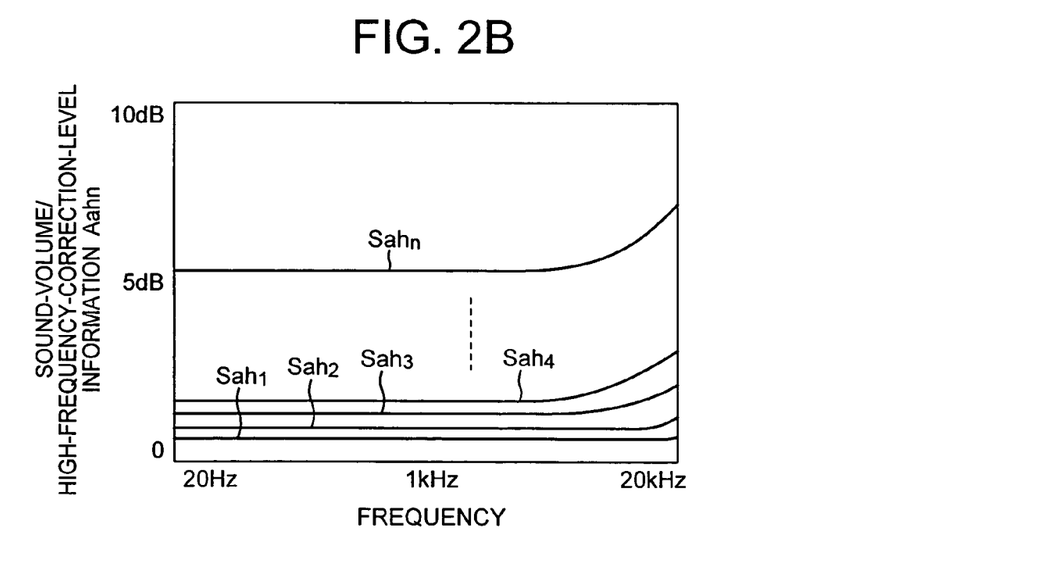

FIGS. 2A and 2B are graphs for obtaining the sound-volume/high-frequency-correction-level information based on the speed of the vehicle and the music level. FIG. 2A is a graph of the sound-volume/high-frequency-correction-step value with respect to the speed of the vehicle that is stored in the memory unit 441, and FIG. 2B is a graph of the correction-level information that corresponds to the sound-volume/high-frequency-correction-step values.

The speed of the vehicle Vn that is obtained from the vehicle-speed-detection unit 451, and the music level detected by the music-detection unit 411a are divided into three levels (high, medium, low), and one corresponding sound-volume/high-frequency-correction-step value Sahn is selected from the graph shown in FIG. 2A.

When the music level detected by the music-detection unit 411 is low level, the selected sound-volume/high-frequency-correction-step value Sahn is larger than when the value is high level or medium level, and the higher the vehicle speed becomes, the sound-volume/high-frequency-correction-step value Sahn becomes larger. Depending on which line shown in FIG. 2A is selected, it is possible to select the fine adjustment amount for fine adjustment of the high-frequency-correction level described above.

Also, one value of sound-volume/high-frequency-correction-level information Aahn is obtained from the graph shown in FIG. 2B based on the selected sound-volume/high-frequency-correction-step value Sahn, and sound correction is performed by the high-frequency-sound-quality-adjustment unit 402a and the full-range-sound-volume-correction unit 403 based on this.

In the example shown in FIG. 2A, when looking at when the music level is in about the middle (medium), the selected sound-volume/high-frequency-correction-step value Sahn increases as the vehicle speed increases. Here, a larger value of 'n' (1 to 9) attached to the sound-volume/high-frequency-correction-step value Sahn, indicates an increase in the amount of high-frequency correction.

Next, the sound-volume/high-frequency-correction-level information Aahn is obtained according to FIG. 2B. As shown in FIG. 2B, the larger the sound-volume/high-frequency-correction-step value Sahn becomes, the larger the amount of high-frequency correction becomes, and the reproduction level increases over the full range of frequencies.

On the other hand, when the music level is low (low), the slope of the line becomes very steep as shown in FIG. 2A, and compared with when the music level is in the middle (medium), the selected sound-volume/high-frequency-correction-step value Sahn becomes larger even at the same vehicle speed. Therefore, the amount of high-frequency correction (including the amount of full-range correction) becomes larger even at the same vehicle speed.

However, when the music level is large (high), the slope of the line becomes gentle as shown in FIG. 2A, and when compared with when the music level is in the middle (medium), the selected sound-volume/high-frequency-correction-step value Sahn becomes smaller even at the same vehicle speed. Therefore, the amount of high-frequency correction (including the amount of full-range correction) becomes smaller even at the same vehicle speed.

In this way, the sound-volume/high-frequency-correction-step value Sahn becomes large in proportion to the vehicle speed, however, when the current music level obtained from the music-detection unit 411a is low, fine adjustment is added in which the correction-step value Sahn obtained in proportion to the vehicle speed becomes even larger. In this embodiment, by executing correction by the high-frequency-sound-quality-adjustment unit 402a and full-range-sound-volume-correction unit 403, a correction curve for high-frequency correction is obtained as shown in FIG. 2B.

As a result of performing sound correction based on the sound-volume/high-frequency-correction-level information Aahn, the music level detected by the music-detection unit 411a becomes higher by just the corrected amount. Therefore, when the music level fluctuates greatly by fine adjustment of the high-frequency-correction level, by changing the line selected in FIG. 2A according to the music level (high, medium, low), the high-frequency-correction level frequently changes and control becomes unstable, so greatly increasing the amount of increase of the music level by fine adjustment is not desired. This problem can be solved by further dividing the stages of the music level (large, medium, small).

Also, in this embodiment, low-frequency correction is executed together with high-frequency correction. This low-frequency correction is for increasing the low-frequency reproduction level that becomes difficult to hear due to low-frequency noise such as road noise.

Figure 3A:
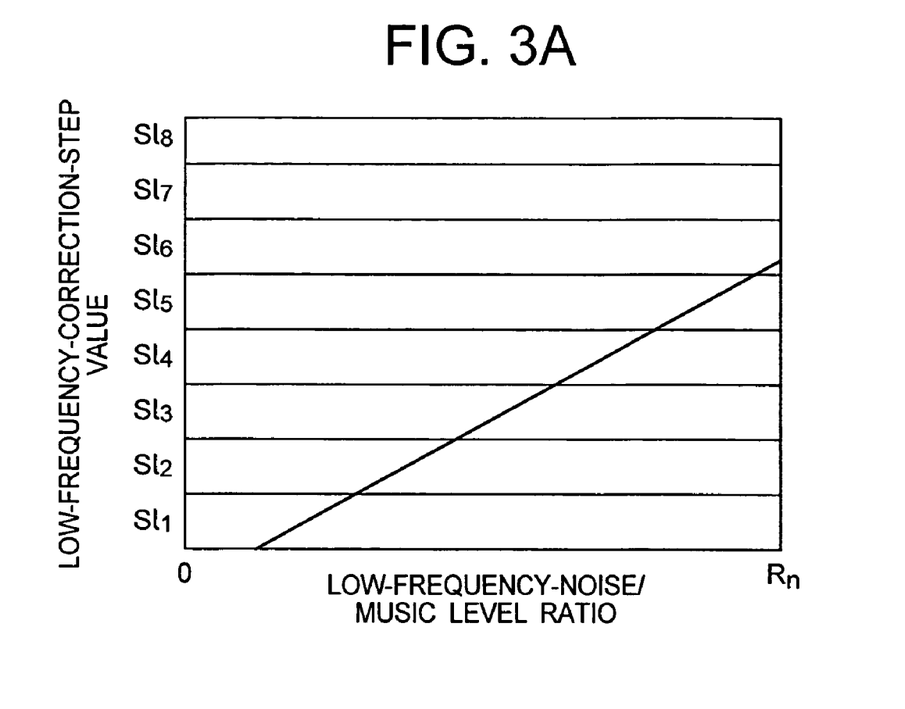
FIGS. 3A and 3B are graphs showing the low-frequency-correction-level information corresponding to the low-frequency noise/music level ratio.
Figure 3B:
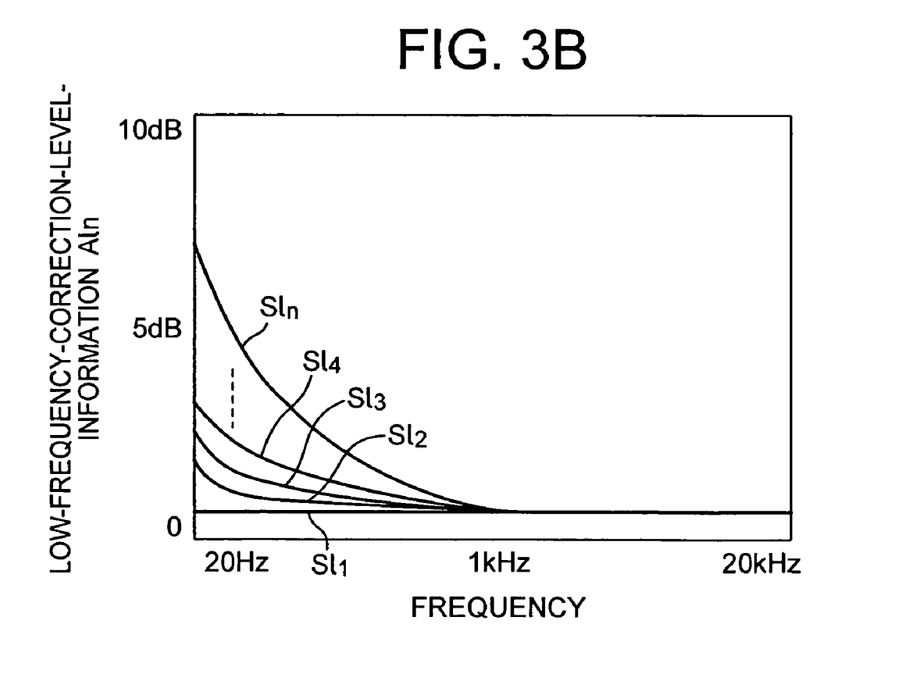

FIGS. 3A and 3B are graphs for obtaining the low-frequency-correction-level information based on low-frequency noise/music level ratio Rn. FIG. 3A is a graph of the low-frequency-correction-step values corresponding to the low-frequency noise/music level ratio Rn, and FIG. 3B is a graph of the low-frequency-correction-level information corresponding to the low-frequency-correction-step value.

In this embodiment, one low-frequency-correction-step value Sln is selected from the graph shown in FIG. 3A based on the low-frequency noise/music level ratio Rn obtained from the low-frequency-noise level obtained by the low-frequency-noise-detection unit 411b, and the music obtained by the music-detection unit 411a. Also, one value of low-frequency-correction-level information Aln is obtained from the graph shown in FIG. 3B based on the selected low-frequency-correction-step value Sln. Sound correction is performed by the low-frequency-sound-quality-adjustment unit 402b based on this value. Here, a larger value of 'n' (1 to 9) attached to the low-frequency-correction-step value Sln, indicates an increase in the amount of low-frequency correction.

With the example shown in FIG. 3A, as the low-frequency noise/music level ratio Rn increases, a larger low-frequency-correction step value Sln is obtained. That is, in the case of the same music level, as the low-frequency noise detected by way of the microphone 400 becomes large, the low-frequency noise/music level ratio Rn also becomes large, and the obtained low-frequency-correction-step value Sln becomes large as well. Also, when the obtained low-frequency-correction-step value Sln becomes large, the correction amount indicated by the corresponding low-frequency-correction-level information Aln becomes large as shown in FIG. 3B. In the example shown in FIG. 3B, as the low-frequency-correction-step value Sln increases, the amount of correction increases.

Also, the sound-volume/high-frequency-correction-level information Aahn obtained by the sound-volume/high-frequency-correction-level-information-acquisition unit 431a is sent to the sound-quality-adjustment unit 402. And the low-frequency-correction-level information Aln obtained by the low-frequency-correction-level-information-acquisition unit 431b is sent to the sound-quality-adjustment unit 402 and the full-range-sound-volume-correction unit 403.

The sound-quality-adjustment unit 402 comprises a high-frequency-sound-quality-adjustment unit 402a as a high-frequency-correction device, and a low-frequency-sound-quality-adjustment unit 402b as a low-frequency-correction device.

The high-frequency-sound-quality-adjustment unit 402a corrects the sound at frequencies greater than 1 kHz, for example, and the low-frequency-sound-quality-adjustment unit 402b corrects the sound at frequencies less than 1 kHz.

Figure 4A:
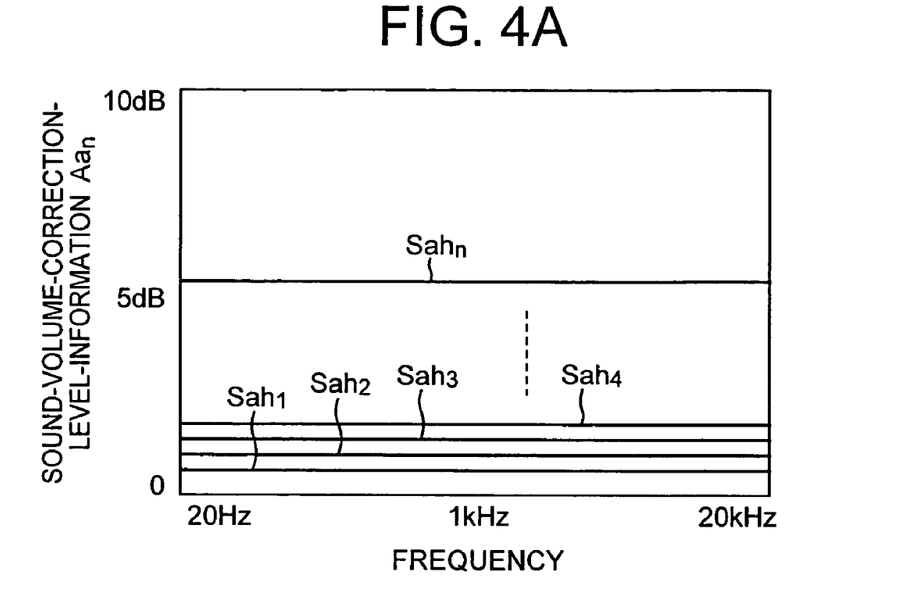
FIGS. 4A and 4B are drawings explaining the sound-volume-correction-level information and high-frequency-correction-level information.
Figure 4B:
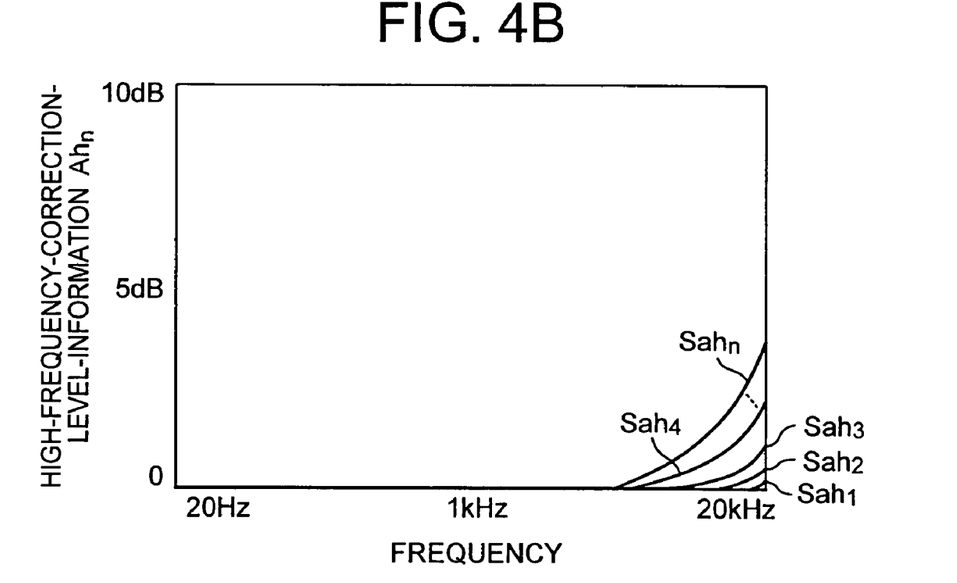

Here, the sound-volume/high-frequency-correction-level information Aahn that is obtained by the sound-volume/high-frequency-correction-level-information-acquisition unit 431a based on the sound-volume/high-frequency-correction-step information Sahn can be considered to be divided into sound-volume-correction-level information Aan (FIG. 4A) and high-frequency-correction-level information Ahn (FIG. 4B) as shown in FIG. 4. The straight lines or curves in FIG. 4A and FIG. 4B are the result of separating the curves in FIG. 2B into the amount of full-range correction and the amount of high-frequency correction.

Also, the sound-volume-correction-level information Aan (FIG. 4A) is sent to the full-range-sound-volume-correction unit 403, and the high-frequency-correction-level information Ahn (FIG. 4B) is sent to the high-frequency-sound-quality-adjustment unit 402a. Moreover, the sound correction is performed by the full-range-sound-volume-correction unit 403 based on the sound-volume-correction-level information Aan, and sound correction is performed by the high-frequency-sound-quality-adjustment unit 402a based on the high-frequency-correction-level information Ahn.

In this embodiment, high-frequency-correction curves as shown in FIG. 2B are obtained by performing full-range correction by the full-range-sound-volume-correction unit 403 and high-frequency correction by the high-frequency-sound-quality-adjustment unit 402a.

On the other hand, the low-frequency-sound-quality-adjustment unit 402b performs low-frequency-sound-quality-adjustment processing based on the value of the low-frequency-correction-level information Aln obtained by the low-frequency-level-information-acquisition unit 431b of the correction unit 401. By doing so, low-frequency-correction curves as shown in FIG. 3B can be obtained.

Figure 5:
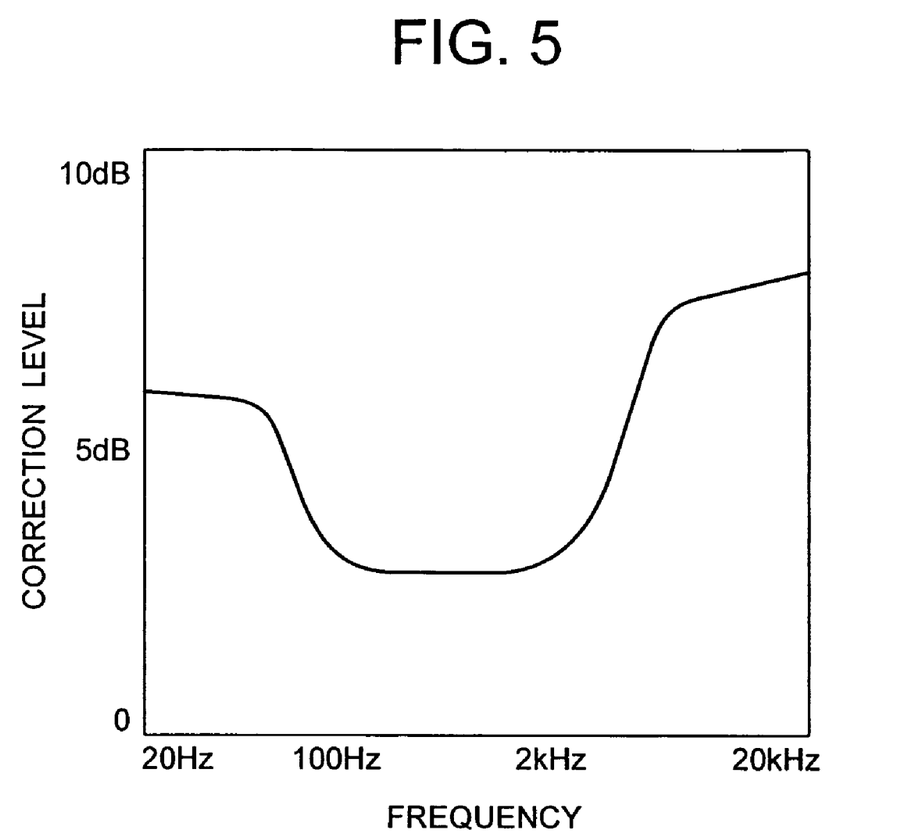
FIG. 5 is an example of the frequency characteristics of sound correction.

In this embodiment, high-frequency correction as shown in FIG. 2B, and low-frequency correction as shown in FIG. 3B are performed at the same time in this way, and a corrected signal according to a correction curve to which both corrections have been added as shown in FIG. 5 is input to the power amplifier.

In this embodiment, since the vehicle speed is high when the vehicle is traveling on a freeway or the like, sound-volume/high-frequency-correction-level information $Aahn_1$, for which the correction amount by the sound-volume/high-frequency-correction-level-information-acquisition unit 431a is comparatively large, is obtained, and since the condition of the road surface is good, low-frequency noise is less than in the case of a normal road, so low-frequency-correction-level information $Aln_2$, for which the correction amount by the low-frequency-correction-level-information-acquisition unit 431b is comparatively small, is obtained.

Also, by combining the sound-volume/high-frequency-correction-level information $Aahn_1$ and the low-frequencycorrection-level information $Aln_2$, frequency characteristics are obtained as shown in FIG. 5 in which the correction amount in the high-frequency range is larger than that in the low-frequency range. As a result, by performing adequate sound correction even when the high-frequency noise due to the sound of the wind, which occurs when the vehicle is traveling on a freeway, is large, it is possible to obtain more natural sound.

It is also possible for the control unit 404 to perform control such that part of the corrected music is detected by the music-detection unit 411a of the correction unit 401 and the correction process is performed again at preset time intervals, or at the timing of an operation from the user.

Next, the operation of the embodiment will be explained.

First, acquisition of the sound-volume/high-frequency-correction-level information Aahn will be explained.

First, the music level is detected by the music-detection unit 411a in the correction unit 401, and the vehicle speed Vn is detected by the vehicle-speed-detection unit 451 in the correction unit 401.

Also, based on the detected music level and the vehicle speed Vn, a sound-volume/high-frequency-correction-step value Sahn is obtained from the sound-volume/high-frequency-correction-step values (FIG. 2A) that correspond to the vehicle speeds and that are stored beforehand in the memory unit 441.

Next, a value of sound-volume/high-frequency-correction-level information Aahn, which corresponds to the sound-volume/high-frequency-correction-step value Sahn obtained from the sound-volume/high-frequency-correction-level information (FIG. 2B) that corresponds to the sound-volume/high-frequency-correction-step values stored beforehand in the memory unit 441, is obtained.

Of the obtained sound-volume/high-frequency-correction-level information Aahn, the sound-volume-correction-level information Aan (FIG. 4A) is sent to the full-range-sound-volume-correction unit 403, and the high-frequency-correction-level information Ahn (FIG. 4B) is sent to the high-frequency-sound-quality-adjustment unit 402a located in the sound-quality-adjustment unit 402.

Also, the high-frequency sound quality is corrected by the high-frequency-sound-quality-adjustment unit 402a based on the sent high-frequency-correction-level information Ahn (FIG. 4B), and the sound-volume of the full range of the reproduced signal is corrected by the full-range-sound-volume-correction unit 403 based on the sent sound-volume-correction-level information Aan (FIG. 4A). All of the operations up to this point are executed under the control of the control unit 404.

Next, acquisition of the low-frequency-correction-level information Aln will be explained.

First, the music level and low-frequency-noise level are detected. This music level is the level of the music signal after passing through the full-range-sound-volume-correction unit 403 and before entering the power amplifier.

The detected music level is detected by the music-detection unit 411a in the correction unit 401.

The low-frequency noise is picked up by the microphone 400 and then passed through a low-pass filter (LPF), after which the low-frequency component that is below a specified frequency (for example, frequencies below 10 Hz) is detected by the low-frequency-noise-detection unit 411b in the correction unit 401 as the low-frequency-noise level.

Moreover, the detected music level and the low-frequency-noise level are compared by the comparison unit 421, and a low-frequency-correction-step value Sln is obtained based on the low-frequency noise/music level ratio that was obtained as a result from the low-frequency-correction-step values (FIG. 3A) that correspond to the low-frequency noise/music level ratio that was stored in the memory unit 441 beforehand.

Next, a value of low-frequency-correction-level information Aln, which corresponds to the obtained low-frequency-correction-step value Sln, is obtained from the low-frequency-correction-level information (FIG. 3B) that corresponds to the low-frequency-correction-step values stored in the memory unit 441 beforehand.

The obtained low-frequency-correction-level information Aln is sent to the low-frequency-sound-quality-adjustment unit 402b in the sound-quality-adjustment unit 402.

The sound is corrected by the low-frequency-sound-quality-adjustment unit 402b based on the sent low-frequency-correction-level information Aln. All of the operations up to this point are executed under the control of the control unit 404.

In the embodiment described above, the music level detected by the music-detection unit 411a is the level of the music signal after it has passed through the sound-quality-adjustment unit 402 and the full-range-sound-volume-correction unit 403 and before it enters the power amp, however, it is also possible for it to be the current sound volume that is adjusted by a sound-volume-control unit or the like.

Also, in FIG. 2A, the music level is defined as having three levels, high, medium and low, however it is not limited to this and it is possible to define it as having more levels than this.

Moreover, the sound-volume/high-frequency-correction-step value Sahn, low-frequency-correction-step value Sln, sound-volume/high-frequency-correction-level information Aahn and the low-frequency-correction-level information Aln can also be further divided according to vehicle model, audio characteristics or the like, and it is also possible to further change them according to the type of music being reproduced (classical, rock, traffic information, etc.). When doing that, the user can select the type of music using the music-type-selection device of the audio apparatus.

Also, the high-frequency-sound-quality-adjustment unit 402a performs adjustment of the sound-volume for frequencies greater than a preset frequency, and the low-frequency-sound-quality-adjustment unit 402b performs adjustment of the sound-volume for frequencies less than a preset frequency, however, it is not limited to this, and one of the units could be constructed such that it performs sound-volume correction for the full range of reproduced frequencies. In that case, the sound-volume-correction-level information Aan described above can be combined with the high-frequency-correction-level information Ahn or the low-frequency-correction-level information Aln, and then sent to the high-frequency-sound-quality-adjustment unit 402a or the low-frequency-sound-quality-adjustment unit 402b, and corrected together. Also, it is possible to combine the sound-volume-level information Aan, high-frequency-correction-level information Ahn, and low-frequency-correction-level information Aln, and perform correction by the full-range-sound-volume-correction unit 403.

With this embodiment, sound-volume/high-frequency correction is performed based on the vehicle speed, so when the high-frequency noise that occurs due to the sound of the wind when traveling at high speed becomes large, full-range-sound-volume adjustment and only high-frequency-sound-quality adjustment are performed; however, when traveling at low speeds over a bad road, only low-frequency correction is performed according to the ratio of the low-frequency noise and music level. Therefore, the embodiment has the effect of being capable of obtaining the optimum sound in all conditions.

Also, since the width of the sound-volume/high-frequency-correction level changes according to the music level, it is possible to obtain even more optimum sound regardless of the size of the music level.

Embodiment 2

Figure 6:
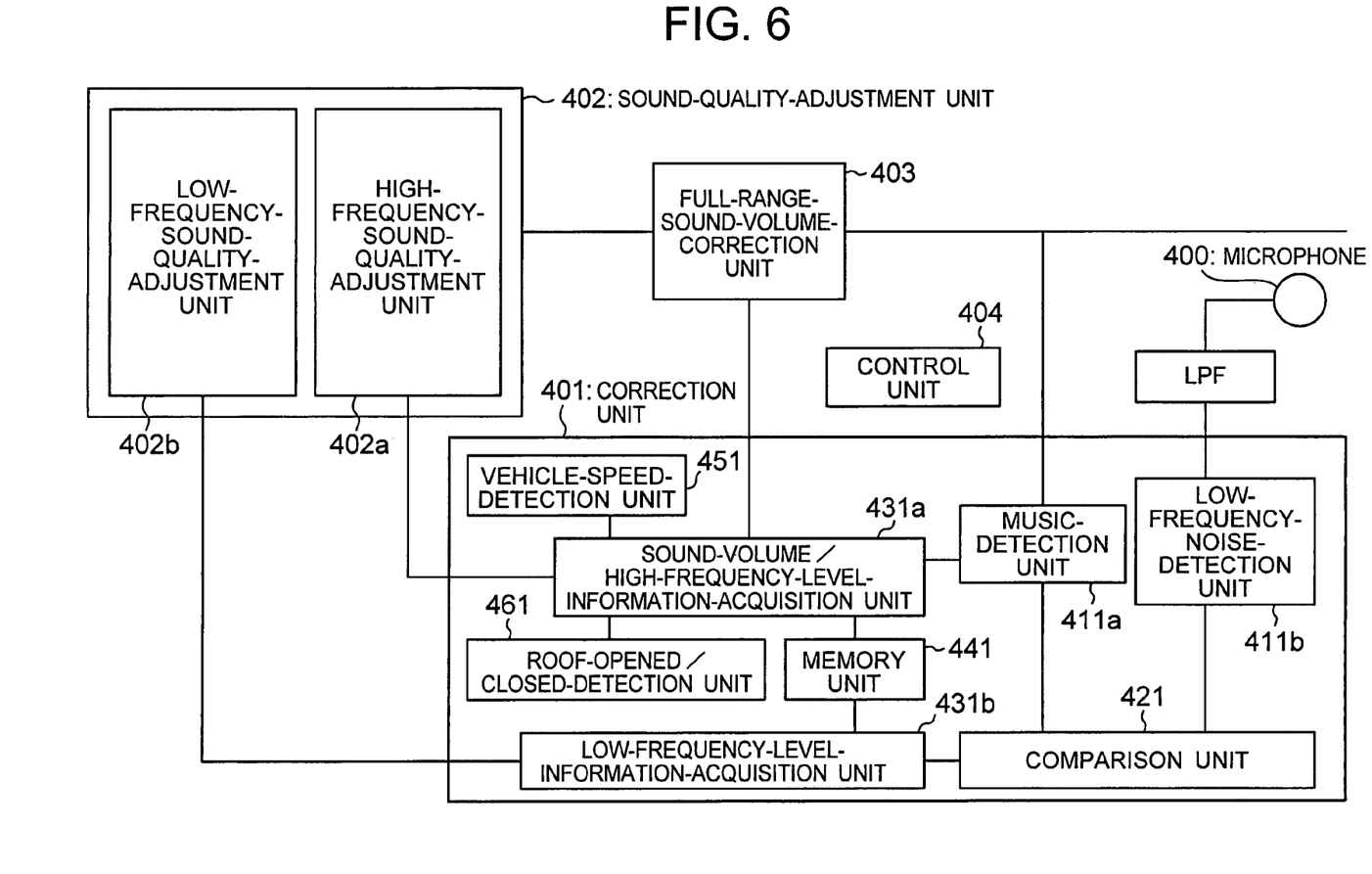
FIG. 6 is an overall schematic drawing of the sound-correction system of a car-audio system of a second embodiment of the invention.

FIG. 6 is a schematic drawing of the overall car-audio sound-correction system of a second embodiment of the invention.

The construction of this second embodiment comprises a roof-opened/closed-detection unit 461 as a second detection device.

The roof-opened/closed-detection unit 461 is for detecting opened/closed information for the roof of the vehicle.

Figure 7:
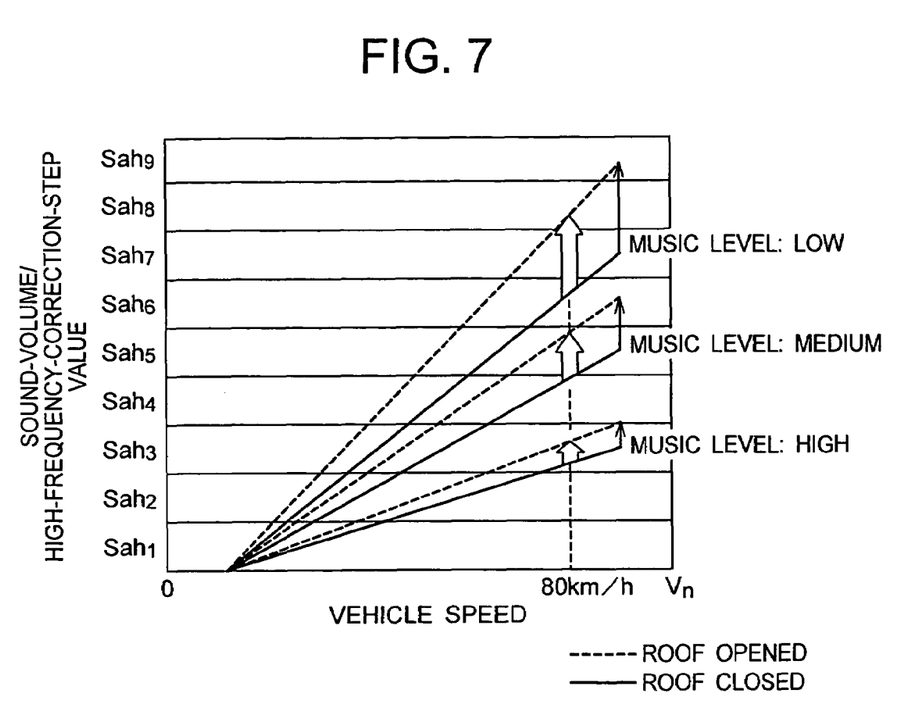
FIG. 7 is a graph showing the sound-volume/high-frequency-correction step values that are set according to the speed of the vehicle, music level and opened/closed status of the roof for the second embodiment of the invention.

FIG. 7 is a graph showing the sound-volume/high-frequency-correction-step values set according to the vehicle speed, music level and the opened/closed status of the roof. Here the parameter of the roof-opened/closed information is taken into consideration for the sound-volume/high-frequency-correction-step values (FIG. 2B) that correspond to the vehicle speed and that were used in embodiment 1, and the sound-volume/high-frequency-correction-step value become higher when the roof is opened than when the roof is closed. The solid line in FIG. 7 is a graph showing the sound-volume/high-frequency-correction-step value Sahn when the roof is closed, and the dashed line is a graph showing the sound-volume/high-frequency-correction-step value Sahn when the roof is opened.

For example, when the vehicle speed is 80 kph and the music level is high, and when the roof is closed, the sound-volume/high-frequency-correction-step value Sah3 is selected according to the example shown in FIG. 7; however, even when the roof is open the same sound-volume/high-frequency-correction-step value Sah3 is selected.

The sound-volume/high-frequency-correction-level information Aahn (FIG. 2B) corresponding to the selected sound-volume/high-frequency-correction-step value Sahn is selected. Here, for convenience, the sound-volume-correction-level information Aan shown in FIG. 4A will be used to explain the obtained sound-volume/high-frequency-correction-level information Aahn, and here the sound-volume/high-frequency-correction-step value Sah3 is maintained and there is no change in the correction level.

Similarly, when the vehicle speed is 80 kph and the music level is medium, and when the roof is closed, the sound-volume/high-frequency-correction-step value Sah4 is selected according to the example shown in FIG. 7; however, when the roof is open, the sound-volume/high-frequency-correction-step value Sah5 is selected.

Also, similarly, when the vehicle speed is 80 kph and the music level is low, when the roof is closed, the sound-volume/high-frequency-correction-step value Sah6 is selected; however, when the roof is open, the sound-volume/high-frequency-correction-step value Sah8 is selected, such that the sound-volume-correction level increases. In this example, the sound-volume/high-frequency-correction-step value does not change when the music level is high, the sound-volume/high-frequency-correction-step value changes by one step when the music level is medium, and the sound-volume/high-frequency-correction-step value changes by two steps when the music level is low.

When the vehicle speed is the same, by having the correction level when the roof is open become larger than the correction level when the roof is closed as the music level becomes lower in this way, it is possible to obtain even more optimum sound.

In the explanation above, the opened/closed status of the roof is detected, however, it is not limited to this, and it is possible to detect the opened/closed status of an opening/closing mechanism installed in the vehicle such as for the opened/closed status of the windows.

In the second embodiment of the invention described above, high-frequency correction and low-frequency correction are performed separately and independently, so since the low-frequency noise due to road noise becomes large when traveling over bad roads, correction is performed for the low-frequency range, and when the high-frequency noise that occurs due to the sound of the wind when traveling at high speed becomes large, it is possible to perform full-range sound-volume adjustment and high-frequency-sound-quality adjustment.

Also, since the sound is corrected such that it becomes larger when the roof is opened, it is possible to obtain more optimum sound regardless of whether or not the roof is opened or closed.

Furthermore, since the sound-volume/high-frequency-correction level becomes larger as the music level becomes lower when the roof is opened, it is possible to obtain more optimum sound regardless of the size of the music level.

The entire disclosure of Japanese Patent Application No. 2003-14455 filed on Jan. 23, 2003 including the specification, claims, drawings and summary is incorporated herein by reference in its entirety.

What is claimed is:

1. A sound-correction apparatus in the audio apparatus installed in a vehicle comprising:
    an adjustment device adjusting the sound-volume in the full frequency range of the reproduced signal;
    a low-frequency-correction device which corrects the sound in the low-frequency range;
    a high-frequency-correction device which corrects sound in the high-frequency range;
    an extraction device that extracts a low-frequency component below the audible frequency of noise picked up by a microphone;
    a first detection device that detects the vehicle speed;
    a second detection device which detects the amount of adjustment by said adjustment device;
    a first calculation device that calculates the amount of low-frequency correction that is corrected by said low-frequency-correction device according to the ratio of said low-frequency component extracted by said extraction device, and said adjustment amount detected by said second detection device; and
    a second calculation device that calculates the amount of high-frequency correction that is corrected by said high-frequency-correction device according to said detected vehicle speed,
    wherein the extraction device comprises a low pass filter used to extract the low-frequency component below the audible frequency of noise picked up by the microphone.

2. The sound-correction apparatus of claim 1 comprising:
    a memory device that stores said amount of low-frequency correction in correspondence to the ratio of said low-frequency component extracted by said extraction device, and said amount of adjustment detected by said second detection device, and stores said amount of high-frequency correction in correspondence to said detected adjustment amount and said vehicle speed; and wherein said low-frequency-correction device performs correction based on said amount of low-frequency correction stored in said memory device, and said high-frequency-correction device performs correction based on said amount of high-frequency correction stored in said memory device.

3. The sound-correction apparatus of claim 1 wherein said amount of low-frequency correction increases with respect to said adjustment amount detected by said second detection device according as the level of said low-frequency component extracted by said extraction device increases.

4. The sound-correction apparatus of claim 1 wherein said amount of low-frequency correction is the amount of sound at frequencies below a specified frequency that is corrected, and it increases according as the frequency is lower.

5. The sound-correction apparatus of claim 1 wherein said amount of high-frequency correction is the amount of the sound at frequencies above a specified frequency that is corrected, and it increases according as the frequency is higher.

6. The sound-correction apparatus of claim 1 wherein said amount of high-frequency correction increases according as said vehicle speed increases.

7. The sound-correction apparatus of claim 1 wherein said amount of high-frequency correction decreases according as said adjustment amount detected by said second detection device increases.

8. A sound-correction method for the audio apparatus installed in a vehicle having an adjustment process of adjusting the sound volume of the full frequency range of the signal being reproduced, comprising:

an extraction process of extracting a low-frequency component of noise picked up by a microphone below the audible frequency;

a first detection process of detecting the vehicle speed;

a second detection process of detecting the opened/closed status of an opening/closing mechanism in the vehicle;

a third detection process of detecting the adjustment amount by said adjustment process;

an acquisition process of acquiring the ratio of said low-frequency component extracted by said extraction process and said adjustment amount detected by said third detection process;

a first calculation process of calculating the low-frequency-correction characteristics according to the ratio calculated by said acquisition process;

a second calculation process of calculating the high-frequency-correction characteristics according to said adjustment amount, said vehicle speed and said opened/closed status;

a low-frequency-correction process of correcting the sound in the low-frequency range based on said low-frequency-correction characteristics calculated by said first calculation process; and a high-frequency-correction process of correcting the sound in the high-frequency range based on said high-frequency-correction characteristics calculated by said second calculation process, wherein the extraction process comprises the process of extracting the low-frequency component below the audible frequency of noise picked up by the microphone.

9. The method of claim 8, wherein the extraction process step uses a low-pass filter to extract the low frequency component.

* * * * *